US007858464B2

(12) United States Patent
Chae et al.

(10) Patent No.: US 7,858,464 B2
(45) Date of Patent: Dec. 28, 2010

(54) METHODS OF MANUFACTURING NON-VOLATILE MEMORY DEVICES HAVING INSULATING LAYERS TREATED USING NEUTRAL BEAM IRRADIATION

(75) Inventors: Soo-doo Chae, Gyeonggi-do (KR); Chung-woo Kim, Gyeonggi-do (KR); Choong-man Lee, Seoul (KR); Yung-hee Lee, Seoul (KR); Chan-jin Park, Gyeonggi-do (KR); Sung-wook Hwang, Seoul (KR); Jeong-hee Han, Gyeonggi-do (KR); Do-haing Lee, Gyeonggi-do (KR); Jin-seok Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 9 days.

(21) Appl. No.: 12/346,934

(22) Filed: Dec. 31, 2008

(65) Prior Publication Data
US 2009/0181531 A1 Jul. 16, 2009

(30) Foreign Application Priority Data
Jan. 4, 2008 (KR) ............... 10-2008-0001440

(51) Int. Cl.
*H01L 21/336* (2006.01)
*H01L 21/8234* (2006.01)
*H01L 21/8238* (2006.01)
(52) U.S. Cl. ............... 438/201; 438/211; 438/257; 438/593; 257/E29.129; 257/E29.3; 257/E21.179; 257/E21.422; 257/E21.68

(58) Field of Classification Search ............... 438/201, 438/211, 257, 593, FOR. 203; 257/E29.129, 257/E29.3, E21.179, E21.422, E21.68
See application file for complete search history.

(56) References Cited

U.S. PATENT DOCUMENTS

| 4,776,925 | A | 10/1988 | Fossum et al. | |
|---|---|---|---|---|
| 6,124,620 | A | 9/2000 | Gardner et al. | |
| 6,319,798 | B1 * | 11/2001 | Yu | 438/527 |
| 7,161,174 | B2 | 1/2007 | Ahn et al. | |
| 2007/0064468 | A1 * | 3/2007 | Seol et al. | 365/129 |
| 2008/0020571 | A1 * | 1/2008 | Wurm | 438/680 |
| 2008/0271990 | A1 * | 11/2008 | Ino et al. | 204/192.15 |
| 2008/0305598 | A1 * | 12/2008 | Horsky et al. | 438/303 |

FOREIGN PATENT DOCUMENTS

KR     1020060089105 A     8/2006

* cited by examiner

*Primary Examiner*—Michelle Estrada
(74) *Attorney, Agent, or Firm*—Myers Bigel Sibley & Sajovec

(57) ABSTRACT

Methods of manufacturing non-volatile memory devices that can reduce or prevent loss of charges stored in a charge storage layer and/or that can improve charge storage capacity by neutral beam irradiation of an insulating layer are disclosed. The methods include forming a tunneling insulating layer on a substrate, forming a charge storage layer on the tunneling insulating layer, forming a blocking insulating layer on the charge storage layer, irradiating the blocking insulating layer and/or the tunneling insulating layer with a neutral beam, and forming a gate conductive layer on the blocking insulating layer.

17 Claims, 15 Drawing Sheets

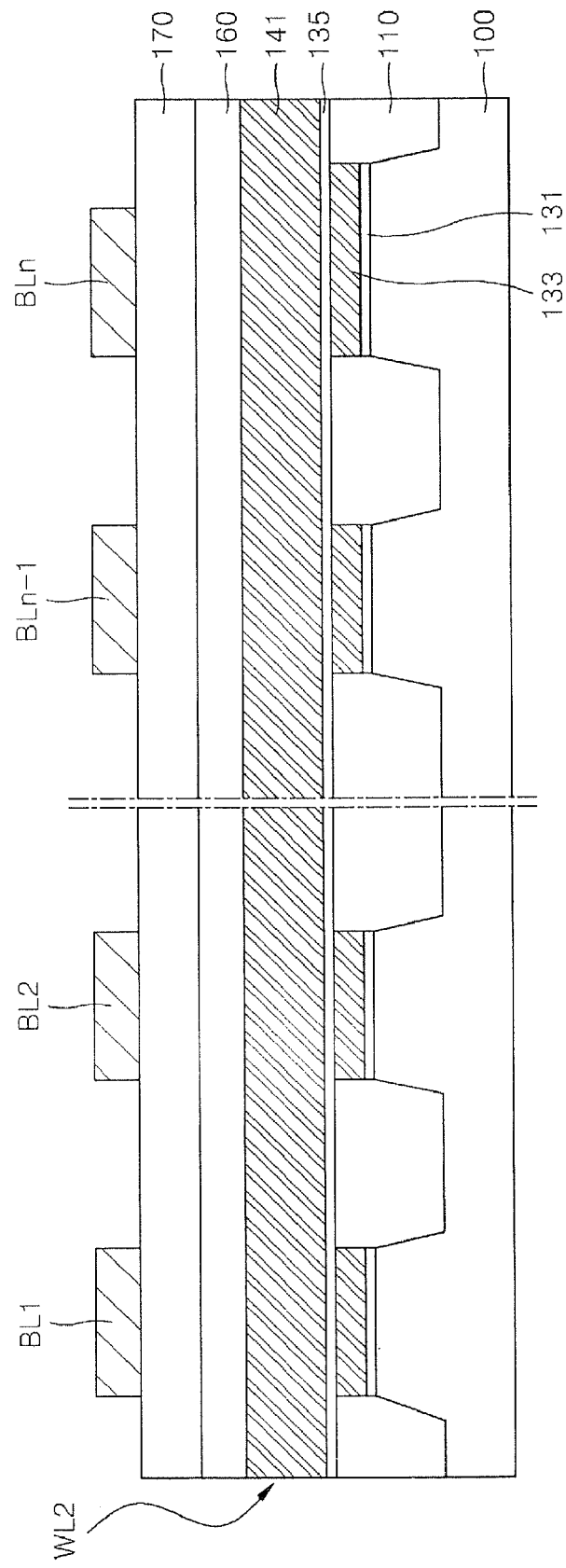

METHODS OF MANUFACTURING NON-VOLATILE MEMORY DEVICES HAVING INSULATING LAYERS TREATED USING NEUTRAL BEAM IRRADIATION

CROSS-REFERENCE TO RELATED PATENT APPLICATION

This application claims the benefit of Korean Patent Application No. 10-2008-0001440, filed on Jan. 4, 2008, in the Korean Intellectual Property Office, the disclosure of which is incorporated herein in its entirety by reference.

BACKGROUND

1. Field of the Invention

The present invention relates to semiconductor device manufacturing, and more particularly, to methods of manufacturing non-volatile memory devices.

2. Description of the Related Art

Non-volatile memory devices are semiconductor memory devices that can retain stored data even if the power supply is abruptly interrupted. In recent years, owing to the increased demand for compact portable electronic products, such as portable multimedia reproduction devices, digital cameras, and personal digital assistants (PDAs), research into high-capacity high-integrated non-volatile memory devices for use in compact portable electronic products has rapidly progressed. Non-volatile memory devices may be classified into programmable read-only memories (PROMs), erasable and programmable read-only memories (EPROMs), and electrically erasable and programmable read-only memories (EEPROMs). A typical example of the non-volatile memory device is a flash memory device.

The flash memory device performs an erase operation and a rewrite operation in block units. Also, since the flash memory device has high integration and good data retention characteristics, the flash memory device may function as a main memory in a system and be used in an ordinary dynamic random access memory (DRAM) interface. Furthermore, since the flash memory device may be inexpensively fabricated, the flash memory device may be used as a subsidiary storage device instead of a conventional hard disk.

A cell transistor of a conventional flash memory includes a tunneling insulating layer disposed on a semiconductor substrate, a charge storage layer, a blocking insulating layer, and a control gate that are stacked sequentially. The flash memory device performs a write operation using a hot electron injection or Fowler-Nordheim tunneling (F-N tunneling) mechanism, and it performs an erase operation through the F-N tunneling mechanism. Cell characteristics of the flash memory device depend on the thickness of the tunneling insulating layer, a contact area between the charge storage layer and the semiconductor substrate, a contact area between the charge storage layer and the control gate, and/or the thickness of the blocking insulating layer. The cell characteristics of the flash memory device may include program speed, erase speed, the distribution of program cells, and the distribution of erase cells. Also, other characteristics related to the reliability of cells of the flash memory device are program/erase endurance and data retention.

As memory devices become smaller, it becomes more difficult to prevent current from leaking in insulating layers formed of silicon oxide, and thus research into high dielectric materials (i.e., high-k materials) that can be used as insulating layers in non-volatile memory devices, has been conducted. However, when high dielectric materials are used, undesirable charge capture due to defects included in the dielectric material can occur, thereby deteriorating the reliability of devices.

SUMMARY

Some embodiments of the present invention provide methods of manufacturing non-volatile memory devices that can reduce or prevent loss of charges stored in a charge storage layer and/or that can improve charge storage capacity by neutral beam irradiation of an insulating layer.

Some embodiments of the present invention also provide non-volatile memory devices formed using the methods of manufacturing a non-volatile memory device.

According to some embodiments of the present invention, there is provided a method of manufacturing a non-volatile memory device including forming a tunneling insulating layer on a semiconductor layer, forming a charge storage layer on the tunneling insulating layer, forming a blocking insulating layer on the charge storage layer, performing a first irradiation operation for irradiating a first neutral beam to the blocking insulating layer, and forming a gate conductive layer on the blocking insulating layer.

In some embodiments of the present invention, the method may further include performing a first annealing operation for annealing the blocking insulating layer after the first irradiation operation is performed. The first annealing operation may be performed before or after the forming of the gate conductive layer is performed. The first annealing operation may include: forming a capping layer on the blocking insulating layer to which the neutral beam is irradiated; and annealing the blocking insulating layer.

In some embodiments of the present invention, the capping layer may include a metal, silicon oxide ($SiO_2$), silicon oxynitride (SiON), silicon nitride ($Si_3N_4$), Si rich nitride (SRN), aluminum oxide ($Al_2O_3$), aluminum nitride (AlN), hafnium oxide ($HfO_2$), hafnium silicon oxide (HfSiO), hafnium silicon oxynitride (HfSiON), hafnium oxynitride (HfON), hafnium aluminum oxide (HfAlO), zirconium oxide ($ZrO_2$), tantalum oxide ($Ta_2O_3$), hafnium tantalum oxide ($HfTa_xO_y$), lanthanum oxide (LaO), lanthanum aluminum oxide (LaAlO), and/or lanthanum hafnium oxide (LaHfO), or a combination thereof.

In some embodiments of the present invention, the method may further include a second irradiation operation for irradiating a second neutral beam to the tunneling insulating layer. The method may further include performing a second annealing operation for annealing the tunneling insulating layer after the second irradiation operation is performed. The second annealing operation may be performed before or after the forming of the charge storage layer is performed.

In some embodiments of the present invention, one or both of the first neutral beam and the second neutral beam may include neutral oxygen, nitrogen, fluorine, and/or chlorine atoms. One or both of the first neutral beam and the second neutral beam may have energy in the range of 1 eV through 200 eV.

In some embodiments of the present invention, one or all the tunneling insulating layer, the charge storage layer, and the blocking insulating layer may include $SiO_2$, SiON, $Si_3N_4$, SRN, $Al_2O_3$, AlN, $HfO_2$, HfSiO, HfSiON, HfON, HfAlO, $ZrO_2$, $Ta_2O_3$, $HfTa_xO_y$, LaO, LaAlO, LaHfO, and/or a metallic oxide, or a combination thereof.

In some embodiments of the present invention, the gate conductive layer may include poly-silicon, aluminum (Al), ruthenium (Ru), tantalum (Ta), tantalum nitride (TaN), titanium (Ti), titanium nitride (TiN), tungsten (W), tungsten nitride (WN), tungsten silicide (WSi), hafnium (Hf), hafnium nitride (HfN), niobium (Nb), molybdenum (Mo), molybdenum nitride ($Mo_2N$), ruthenium oxide layer ($RuO_2$), iridium (Ir), platinum (Pt), cobalt (Co), chrome (Cr), palladium (Pd), and/or nickel silicide (NiSi).

In some embodiments of the present invention, the semiconductor layer may include a silicon substrate, a silicon-on-insulator substrate, a silicon-on-sapphire substrate, a germanium substrate, a silicon-germanium substrate, and/or a gallium-arsenide substrate.

According to further embodiments of the present invention, a non-volatile memory device includes a tunneling insulating layer on a semiconductor layer; a charge storage layer on the tunneling insulating layer; a blocking insulating layer on the charge storage layer; and a gate conductive layer on the blocking insulating layer, wherein one or both of the tunneling insulating layer and the blocking insulating layer are treated by neutral beam irradiation and annealing.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

FIGS. 3A and 3B are cross-sectional views taken along lines I-I' and II-II' of FIG. 2, respectively;

DETAILED DESCRIPTION

Figure 1:
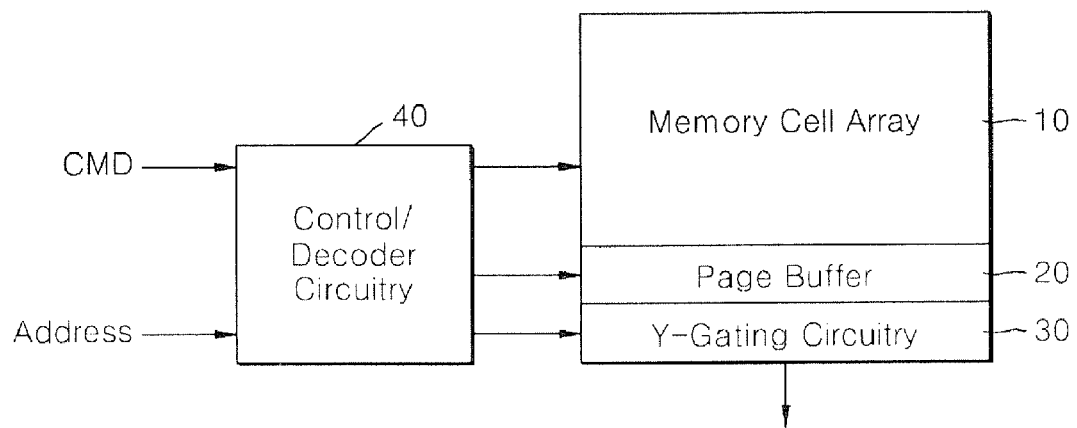
FIG. 1 is a block diagram of a nonvolatile memory device according to some embodiments of the present invention.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

FIG. 1 is a block diagram of a nonvolatile memory device according to an embodiment of the present invention.

Referring to FIG. 1, the nonvolatile memory device may include a memory cell array 10, a page buffer 20, a Y-gating circuit 30, and a control/decoder circuit 40.

The memory cell array 10 may include a plurality of memory blocks, and each of the plurality of memory blocks may include a plurality of nonvolatile memory cells. The nonvolatile memory cells may be flash memory cells, such as NAND flash memory cells or NOR flash memory cells. The page buffer 20 can temporarily store data to be written in the memory cell array 10, or data to be read from the memory cell array 10. The Y-gating circuitry 30 can transmit data stored in the page buffer 20. The control/decoder circuitry 40 can receive a command and an address from the outside, output a control signal to write data in the memory cell array 10 and/or to read data from the memory cell array 10, and decode the address. The control/decoder circuitry 40 may output a control signal for input and output of data to the page buffer 20 and provide address information to the Y-gating circuitry 30.

Figure 2:
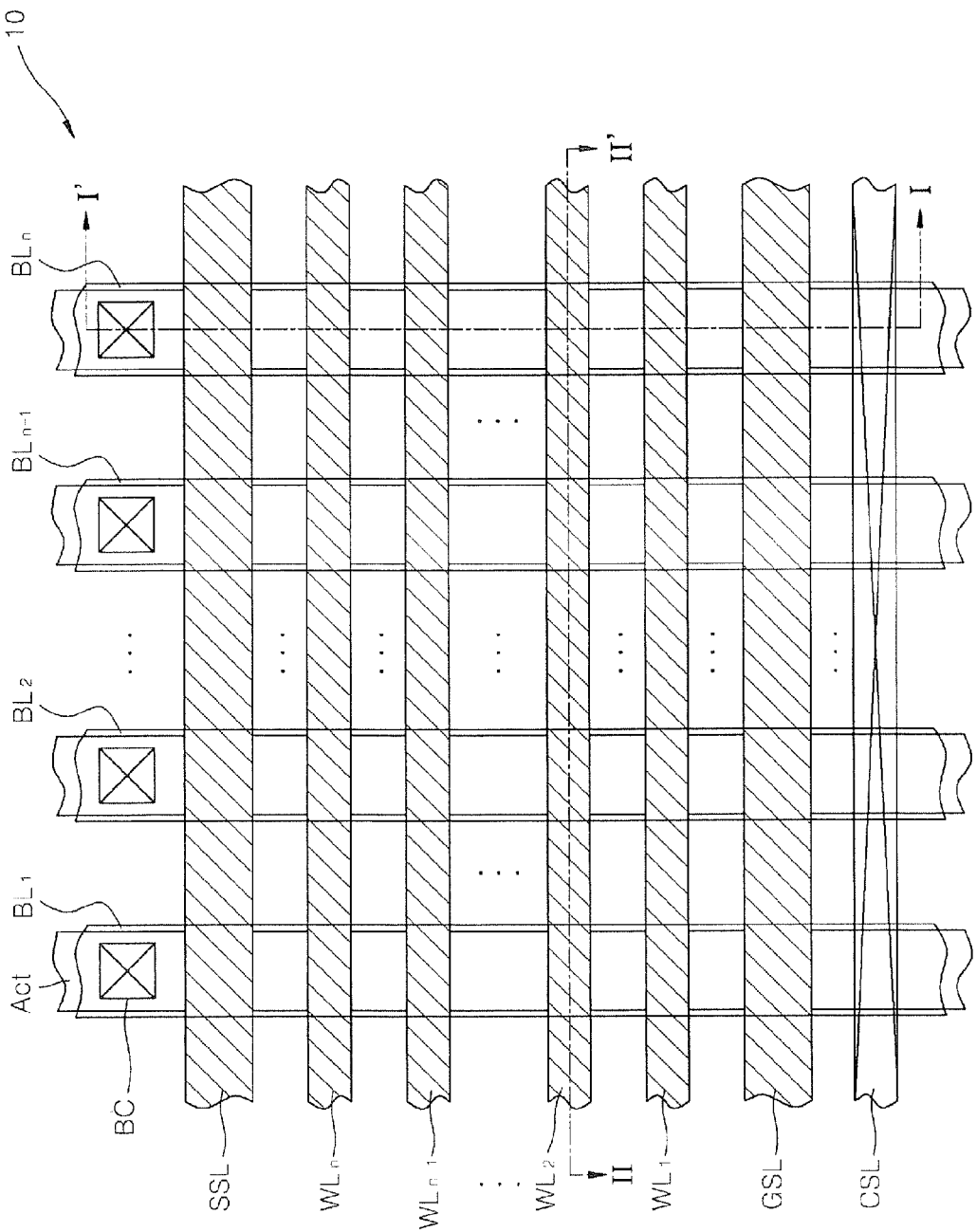
FIG. 2 illustrates the layout (plan view) of a portion of a memory cell array of a nonvolatile memory device according to some embodiments of the present invention.
Figure 3A:
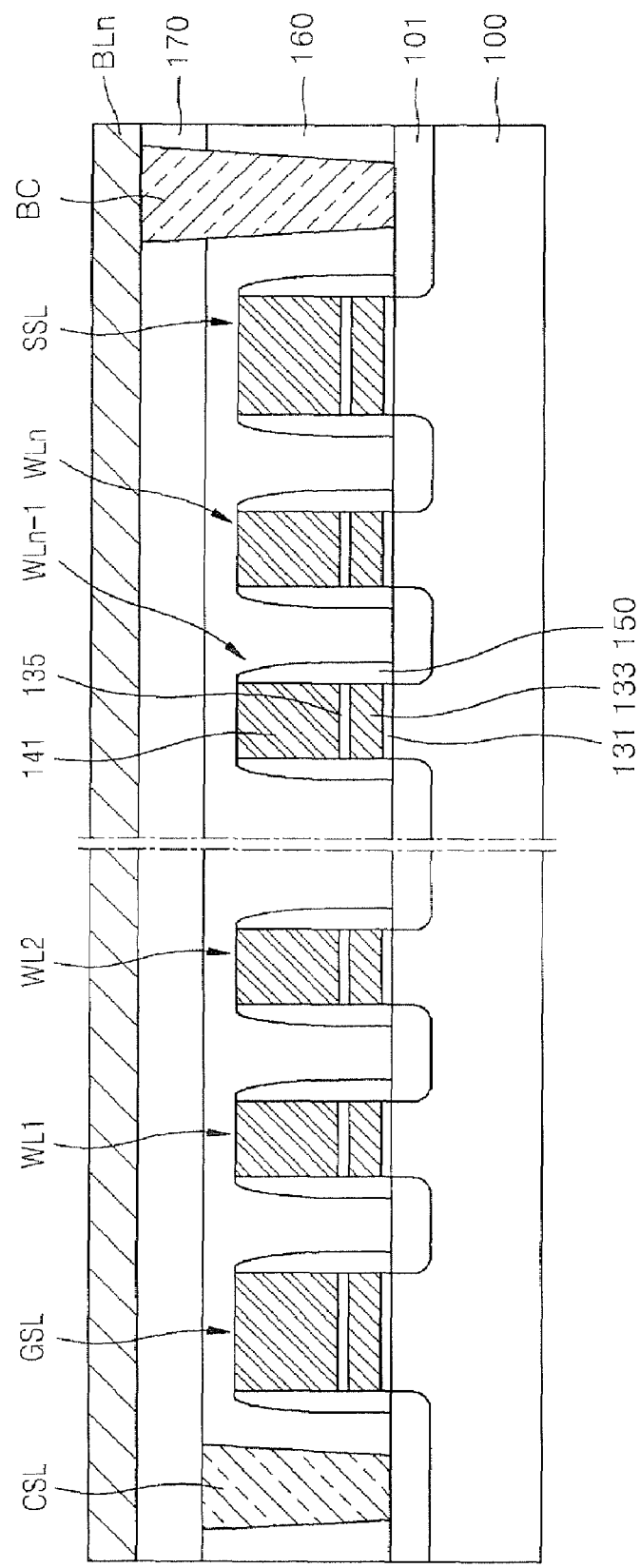

FIG. 2 illustrates the layout of a portion of a memory cell array according to an embodiment of the present invention. The portion of the memory cell array shown in FIG. 2 may be a portion of the memory cell array 10 in FIG. 1. FIGS. 3A and 3B are cross-sectional views taken along lines I-I' and II-II' of FIG. 2, respectively.

Referring to FIGS. 2 and 3A and 3B, the memory cell array 10 may include a plurality of active regions Act that are defined by device isolation regions 110 formed in a semiconductor layer 100. The semiconductor layer 100 can include a substrate and/or an epitaxial layer, a silicon on insulator layer, or the like. The active regions Act may have the form of parallel lines.

A string selection line SSL and a ground selection line GSL may run across and over the active regions Act. A plurality of word lines WL1, WL2, ..., WLn-1, and WLn may run across and over the active regions Act between the string selection line SSL and the ground selection line GSL. The string selection line SSL, the ground selection line GSL, and the word lines WL1, WL2, ..., WLn-1, and WLn may be parallel to one another. Impurity regions 101 may be formed in the active regions Act adjacent to both sides of each of the word lines WL1, WL2, ..., WLn-1, and WLn, the string selection line SSL, and the ground selection line GSL. As a result, a string selection transistor, cell transistors, and a ground selection transistor that are connected in series are formed. The string selection transistor, the ground selection transistor, and the cell transistors interposed therebetween may constitute a unit memory block. The impurity region 101 disposed adjacent to the string selection line SSL and opposite to the ground selection line GSL may be defined as a drain region of the string selection transistor. Also, the impurity region 101 disposed adjacent to the ground selection line GSL and opposite to the string selection line SSL may be defined as a source region of the ground selection transistor.

Each of the word lines WL1, WL2, ..., WLn-1, and WLn may include a tunneling insulating layer 131, a charge storage layer 133, a blocking insulating layer 135, and a cell gate conductive layer 141 that are stacked sequentially on the semiconductor layer 100. Although not illustrated, each of the word lines WL1, WL2, ..., WLn-1, and WLn may further include a cell barrier conductive layer and a word line conductive layer that are stacked sequentially on the cell gate conductive layer 141.

Each of the tunneling insulating layer 131 and the charge storage layer 133 may be separated into portions with respect to the cell transistors disposed adjacently in the direction of the word lines WL1, WL2, ..., WLn-1, and WLn. Top surfaces of the device isolation regions 110 may be at substantially the same level as a top surface of the charge storage layer 133. The tunneling insulating layer 131 may be a silicon oxide layer. The charge storage layer 133 may be a charge trapping layer or a floating gate conductive layer. The blocking insulating layer 135 may be shared among the cell transistors disposed adjacently in the direction of the word lines WL1, WL2, ..., WLn-1, and WLn. A spacer 150 may be disposed on side surfaces of the tunneling insulating layer 131, the charge storage layer 133, the blocking insulating layer 135, and the cell gate conductive layer 141. The spacer 150 may be formed as a multi layer.

A string selection line SSL and a ground selection line GSL may have the same stacked structures as word lines WL1, WL2, ..., WLn-1, and WLn as described above. In generally, widths of the string selection line SSL and the ground selection line GSL may be greater than those of the word lines WL1, WL2, ..., WLn-1, and WLn. However, this is exemplary, and the present invention is not limited thereto.

A first interlayer insulating layer 160 is provided on the word lines WL1, WL2, ..., WLn-1, and WLn, the string selection line SSL and the ground selection line GSL. A common source line CSL is disposed through the first interlayer insulating layer 160 and connected to the source region of the ground selection line GSL. The common source line CSL may be disposed parallel to the ground selection line GSL. A second interlayer insulating layer 170 may be provided on the first interlayer insulating layer 160. A bit line plug BC may be disposed through the second interlayer insulating layer 170 and the first interlayer insulating layer 160 and connected to the drain region of the string selection line SSL. Bit lines BL1, BL2, ..., BLn-1, and BLn may be disposed on the second interlayer insulating layer 170 and connected to the bit line plug BC. Also, the bit lines BL1, BL2, ..., BLn-1, and BLn run across and over the word lines WL1, WL2, ..., WLn-1, and WLn. The bit lines BL1, BL2, ..., BLn-1, and BLn may be disposed parallel to the active regions Act.

Figure 4:
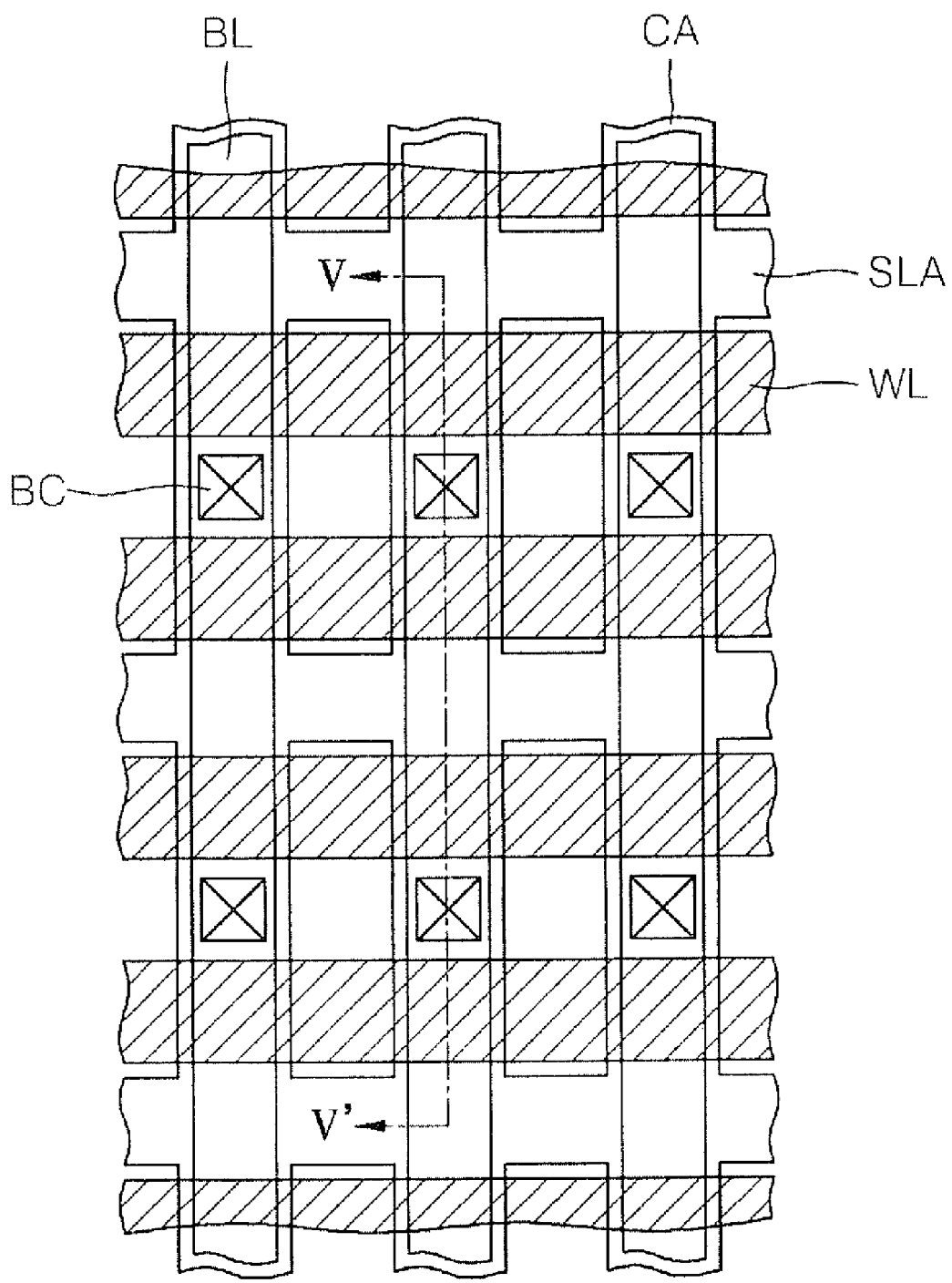
FIG. 4 illustrates the layout (plan view) of a portion of a memory cell array of a nonvolatile memory device according to some embodiments of the present invention.
Figure 5:
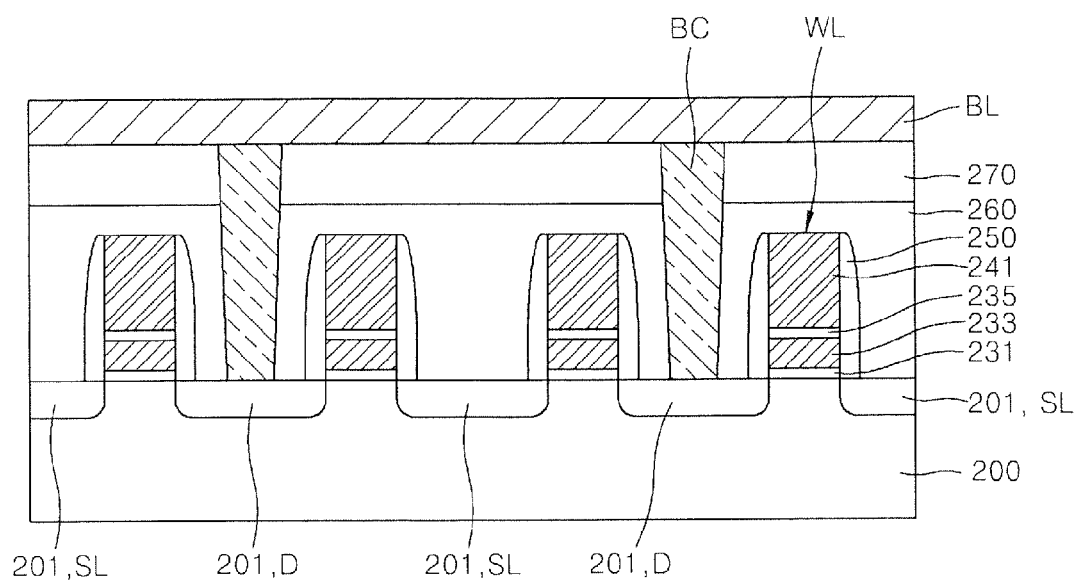
FIG. 5 is a cross-sectional view taken along a line V-V' of FIG. 4.

FIG. 4 illustrates the layout of a portion of a memory cell array of a nonvolatile memory device 10 according to embodiments of the present invention. In the embodiments illustrated in FIG. 4, the memory cell array may be a NOR flash memory. FIG. 5 is a cross-sectional view taken along a line V-V' of FIG. 4.

Referring to FIGS. 4 and 5, an active region is defined by a device isolation layer formed in a semiconductor layer 200. The active region includes a plurality of parallel common source line active regions SLA and a plurality of cell active regions CA disposed across the common source line active regions SLA.

A pair of word lines WL are disposed over each of the cell active regions CA and spaced apart from one another. The word lines WL are disposed adjacent to the common source line active regions SLA, respectively. Impurity regions 201 are formed in the cell active region CA and the common source line active region SLA that are exposed between the pair of word lines WL. As a result, a pair of cell transistors may be defined on each of the cell active regions CA. The impurity region 201 formed in the cell active region CA may be defined as a drain region D, while the impurity region 201 formed in the common source line active region SLA may be defined as a common source region CS.

Each of the word lines WL may include a tunneling insulating layer 231, a charge storage layer 233, a blocking insulating layer 235, and a gate conductive layer 241 that are stacked sequentially on the semiconductor layer 200. Although not illustrated, each of the word lines WL may further include a barrier conductive layer and a word line conductive layer that are stacked sequentially on the gate conductive layer 241. The tunneling insulating layer 231, the charge storage layer 233, the blocking insulating layer 235, and the gate conductive layer 241 may be formed in a similar manner as the tunneling insulating layer 131, the charge storage layer 133, the blocking insulating layer 135, and the cell gate conductive layer 141, respectively, which are described above with reference to FIGS. 2, 3A, and 3B. A spacer 250 may be disposed on side surfaces of the tunneling insulating layer 231, the charge storage layer 233, the blocking insulating layer 235, and the gate conductive layer 241. The spacer 250 may be formed as a multi layer.

An interlayer insulating layer 260 may be provided on the word lines WL. A bit line plug BC may be disposed through the interlayer insulating layer 260 and connected to the drain region D. Bit lines BL may be disposed on the interlayer insulating layer 260 and connected to the bit line plug BC. The bit lines BL may run across and over the word lines WL. The bit lines BL may be disposed parallel to the cell active regions CA.

FIGS. 6A through 6H are cross-sectional views illustrating methods of manufacturing non-volatile memory devices according to some embodiments of the present invention. FIGS. 6A through 6H illustrate methods of manufacturing cell transistors of embodiments described with reference to FIGS. 3A and 3B or of embodiments described with reference to FIGS. 4 and 5.

Figure 6A:
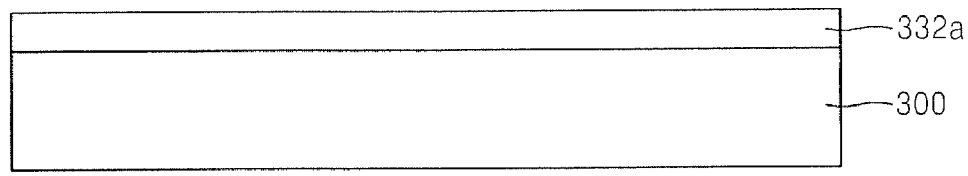
FIGS. 6A through 6H are cross-sectional views illustrating operations of manufacturing non-volatile memory devices according to some embodiments of the present invention.

Referring to FIG. 6A, a first insulating layer 332a is formed on a semiconductor layer 300. The semiconductor layer 300 may include a substrate and/or an epitaxial layer, a silicon on insulator (SOI) layer, etc. Also, the semiconductor layer 300 may be a silicon substrate, a silicon-on-insulator substrate, a silicon-on-sapphire substrate, a germanium substrate, a silicon-germanium substrate, and a gallium-arsenide substrate. The semiconductor layer 300 may be a p-type substrate where a p-type dopant, such as boron (B), is injected to a portion of the semiconductor layer 300, or may be an n-type substrate where an n-type dopant, such as arsenic (As), is injected to a portion of the semiconductor layer 300. However, this is an example, and the present invention is not limited thereto.

The first insulating layer 332a is a layer that becomes a tunneling insulating layer 331 after neutral beam irradiation, to be described later, is performed, and may be formed by thermal oxidation, chemical vapor deposition (CVD), low pressure CVD (LPCVD), plasma enhanced CVD (PECVD), or atomic layer deposition (ALD). The first insulating layer 332a may include one selected from the group consisting of silicon oxide ($SiO_2$), silicon oxynitride (SiON), silicon nitride ($Si_3N_4$), Si rich nitride (SRN), aluminum oxide ($Al_2O_3$), aluminum nitride (AlN), hafnium oxide ($HfO_2$), hafnium silicon oxide (HfSiO), hafnium silicon oxynitride (HfSiON), hafnium oxynitride (HfON), hafnium aluminum oxide (HfAlO), zirconium oxide ($ZrO_2$), tantalum oxide ($Ta_2O_5$), hafnium tantalum oxide ($HfTa_xO_y$), lanthanum oxide (LaO), lanthanum aluminum oxide (LaAlO), lanthanum hafnium oxide (LaHfO), and metallic oxide, or a combination thereof. In the current specification, a SRN layer is a layer having an Si/N atom ratio greater than a stoichiometrical Si/N atom ratio in the $Si_3N_4$ layer. A metal included in the metallic oxide may be platinum (Pt), palladium (Pd), nickel (Ni), ruthenium (Ru), cobalt (Co), chrome (Cr), molybdenum (Mo), tungsten (W), manganese (Mn), iron (Fe), osmium (Os), iridium (Ir), or tantalum (Ta). The first insulating layer 332a may be formed in a single layer structure or a multi layer structure having different energy band gaps. However, the material and structure of forming the energy band gap presented above are examples, and the present invention is not limited thereto.

Figure 6B:
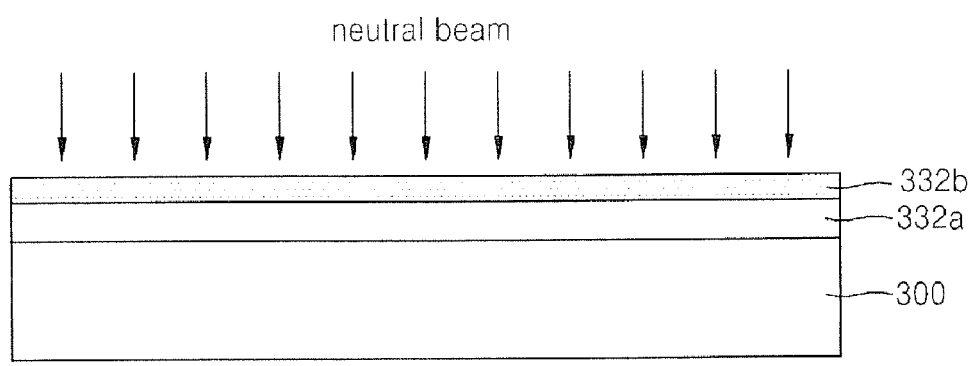

Referring to FIG. 6B, a second insulating layer 332b is formed by irradiating the first insulating layer 332a with a neutral beam. The neutral beam may include neutral oxygen, nitrogen, fluorine, and/or chlorine atoms. Also, the neutral beam may include oxygen radicals, nitrogen radicals, fluorine radicals, and/or chlorine radicals. For example, elements may be activated by plasma, such as a plasma generated using an inductively coupled plasma (ICP) source, and from among the activated elements, ionized elements are blocked and radical elements that are electrically neutral pass through a grid, thereby forming the neutral beam. An example of the neutral beam is a low angle forward-reflected neutral beam. The low angle forward-reflected neutral beam may have energy in the range of 1 eV through 200 eV.

The second insulating layer 332b may be separately formed on the first insulating layer 332a or formed on a portion of the first insulating layer 332a. The elements irradiated by the neutral beam may fill up defects, such as vacancies existing in the first insulating layer 332a, or that exist in an excess atom state, such as an interstitial atom, in a lattice. Accordingly, the second insulating layer 332b generally includes a lower concentration of defects compared to the first insulating layer 332a, and thereby reducing/preventing undesired charge capture due to the defects.

Figure 6C:
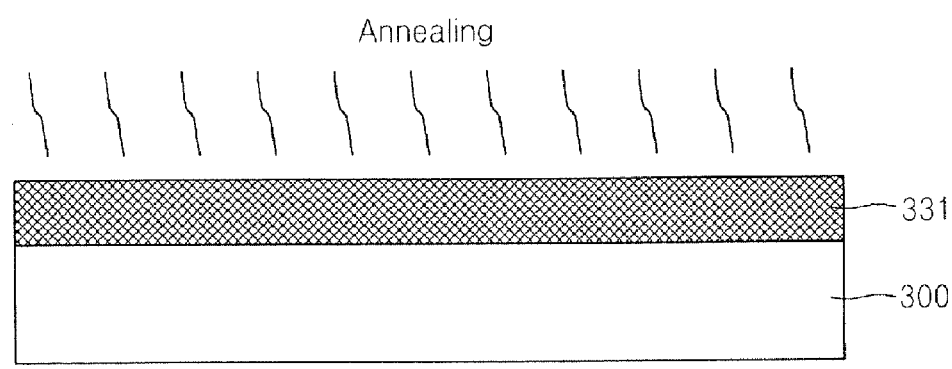

Referring to FIG. 6C, a tunneling insulating layer 331 is formed by annealing the semiconductor layer 300 including the second insulating layer 332b. The annealing treatment may be performed at a high temperature for several minutes, and performed in an atmosphere including argon, oxygen, nitrogen, and/or air, or a combination thereof. The first insulating layer 332a and the second insulating layer 332b are relatively homogenized by the annealing treatment. That is, oxygen atoms, nitrogen atoms, fluorine atoms, and/or chlorine atoms existing as excess atoms in the second insulating layer 332b may diffuse into the first insulating layer 332a, a low concentration area, by thermal activation caused by the annealing treatment, thereby forming the relatively uniform tunneling insulating layer 331. However, if a desired nonvolatile memory characteristic is obtained by decreasing undesired charge capture in the tunneling insulating layer 331, homogenization of the entire area of the tunneling insulating layer 331 is not necessarily required. The tunneling insulating layer 331 may be formed as a single layer structure or a multi layer structure having different energy gaps. The annealing treatment may be optional and omitted when the first insulating layer 332a has a sufficient film quality.

Figure 6D:
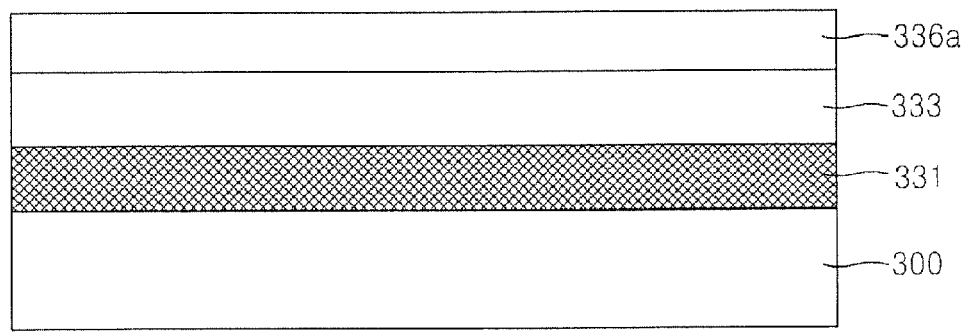

Referring to FIG. 6D, a charge storage layer 333 is formed on the tunneling insulating layer 331. The charge storage layer 333 may be formed by CVD, LPCVD, PECVD, or ALD. The charge storage layer 333 may include $SiO_2$, SiON, $Si_3N_4$, SRN, $Al_2O_3$, AlN, $HfO_2$, HfSiO, HfSiON, HfON, HfAlO, $ZrO_2$, $Ta_2O_5$, $HfTa_xO_y$, LaO, LaAlO, LaHfO, and/or a metallic oxide, or a combination thereof. The charge storage layer 333 may be formed as a single layer structure or a multi layer structure having different energy gaps.

Although not illustrated in the drawing, the charge storage layer 333 may further include nano dots and/or quantum dots which can capture charges. Such nano dots and/or quantum dots have a low band gap energy compared to the charge storage layer 333 and have a relatively large work function, and thus electrons can be captured at a low capture level. Thus, since positions where the charges are captured increase in the charge storage layer 333, reliability of a device and a retention characteristic of the charge storage layer 333 can be improved. The nano dots may include a metal, such as Pt, Pd, Ni, Ru, Co, Cr, Mo, W, Mn, Fe, Os, Ir, Ta, gold (Au), and/or silver (Ag), a semiconductor, such as silicon (Si), germanium (Ge), silicon carbide (SiC), and/or silicon-germanium (SiGe), or a dielectric material, such as $SiO_2$, $HfO_2$, $ZrO_2$ $Al_2O_3$, HfSiO, HfSiON, HfON, and HfAlO. However, the material and structure of forming the charge storage layer 333 are exemplary, and the present invention is not limited thereto.

Referring to FIG. 6D, a third insulating layer 336a is formed on the charge storage layer 333. The third insulating layer 336a is a layer that becomes a blocking insulating layer 335 after neutral beam irradiation, to be described later, is performed, and may be formed by CVD, LPCVD, PECVD, and/or ALD. The third insulating layer 336a may include $SiO_2$, SiON, $Si_3N_4$, SRN, $Al_2O_3$, AlN, $HfO_2$, HfSiO, HfSiON, HfON, HfAlO, $ZrO_2$, $Ta_2O_3$, $HfTa_xO_y$, LaO, LaAlO, LaHfO, and/or a metallic oxide, or a combination thereof. A metal included in the metallic oxide is the same as that described in the first insulating layer 332a. The third insulating layer 336a may be formed in a single layer structure or a multi layer structure having different energy gaps. However, the material and structure of forming the third insulating layer 336a are exemplary, and the present invention is not limited thereto.

Figure 6E:
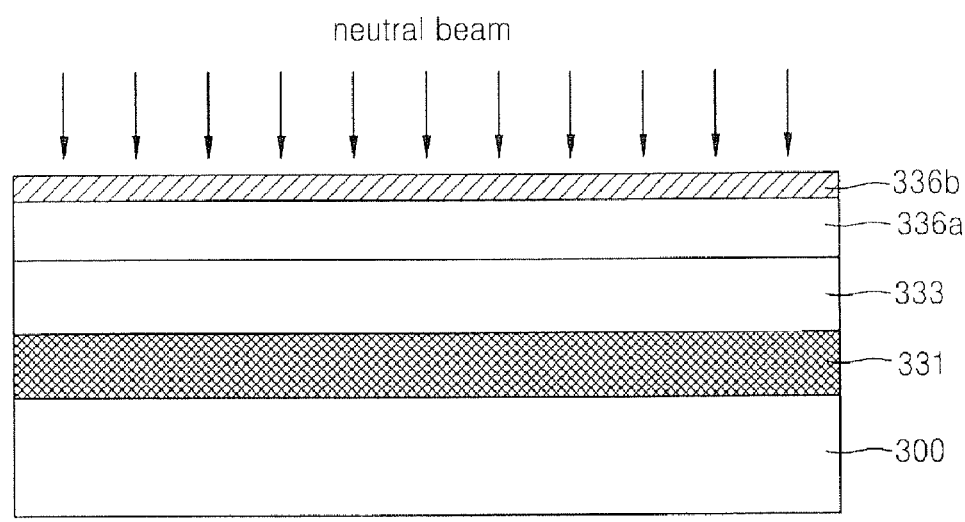

Referring to FIG. 6E, a fourth insulating layer 336b is formed by irradiating the third insulating layer 336a with a neutral beam. The neutral beam may include neutral oxygen, nitrogen, fluorine, and/or chlorine atoms. The neutral beam may include oxygen radicals, nitrogen radicals, fluorine radicals, and/or chlorine radicals. The neutral beam may have energy in the range of 1 eV through 200 eV. The neutral beam may be the same as that used to irradiate the second insulating layer 332b described with reference to FIG. 1B.

The fourth insulating layer 336b may be separately formed on the third insulating layer 336a or formed on a portion of the third insulating layer 336a. The elements irradiated by the neutral beam may fill up defects, such as vacancies existing in the third insulating layer 336a, and/or that exist in an excess atom state, such as interstitial atoms, in a lattice. Accordingly, the fourth insulating layer 336b generally includes a lower concentration of defects compared to the third insulating layer 336a, thereby reducing/preventing undesired charge capture due to the defects.

Figure 6F:
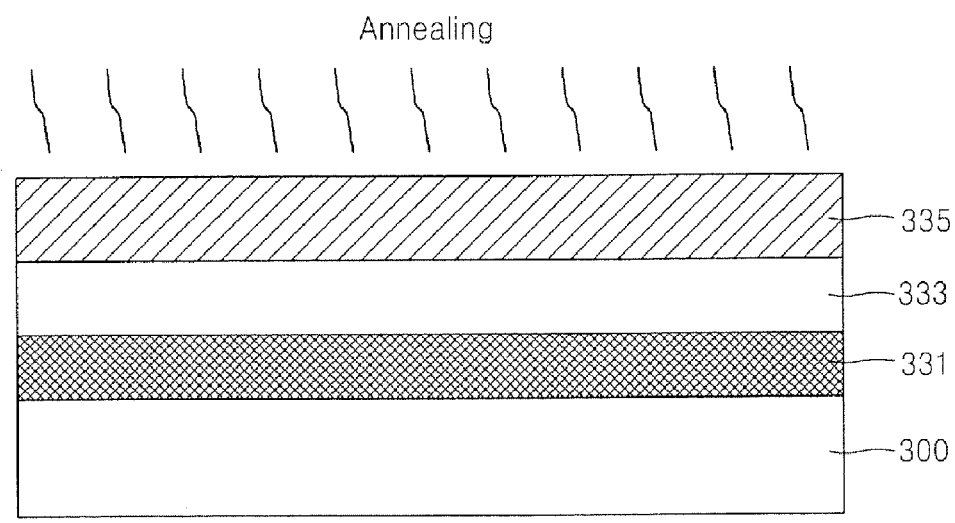

Referring to FIG. 6F, the blocking insulating layer 335 is formed by annealing a resultant where the fourth insulating layer 336b is formed. The annealing treatment may be performed at a high temperature for several minutes and performed in an atmosphere including argon, oxygen, nitrogen, and/or air, or a combination thereof. The third insulating layer 336a and the fourth insulating layer 336b are relatively homogenized by the annealing treatment. That is, oxygen atoms, nitrogen atoms, fluorine atoms, and/or chlorine atoms existing as excess atoms in the fourth insulating layer 336b may diffuse into the third insulating layer 336a, which is a low concentration area, by thermal activation caused by the annealing treatment, thereby forming the relatively uniform blocking insulating layer 335. However, if a desired nonvolatile memory characteristic is obtained by decreasing undesired charge capture in the blocking insulating layer 335, homogenization of the entire area of the blocking insulating layer 335 may not be required. The blocking insulating layer 335 may be formed in a single layer structure or a multi layer structure having different energy gaps.

Figure 6G:
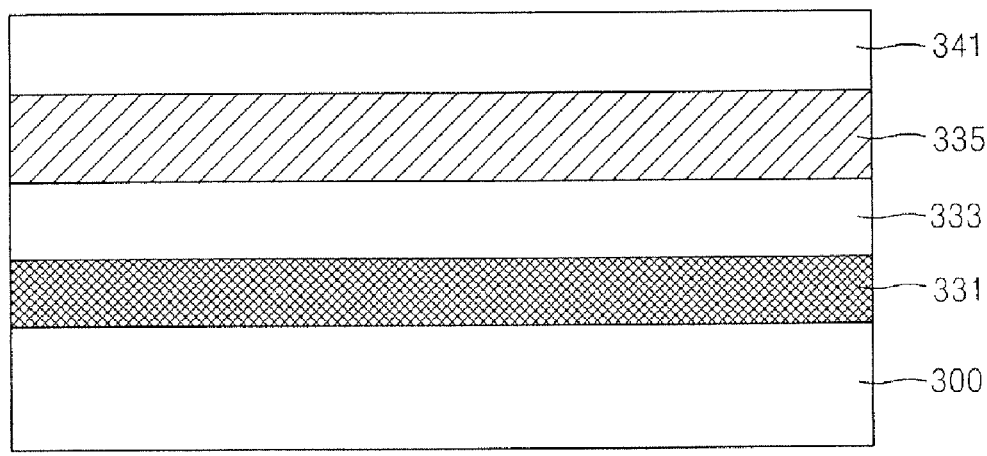

Referring to FIG. 6G, a gate conductive layer 341 is formed on the blocking insulating layer 335. The gate conductive layer 341 may be formed by CVD, LPCVD, PECVD, and/or ALD. The gate conductive layer 341 may include poly-silicon, Al, Ru, Ta, tantalum nitride (TaN), titanium (Ti), titanium nitride (TiN), W, tungsten nitride (WN), tungsten silicide (WSi), hafnium (Hf), hafnium nitride (HfN), niobium (Nb), Mo, molybdenum nitride ($Mo_2N$), ruthenium oxide ($RuO_2$), Ir, Pt, Co, Cr, Pd, and/or nickel silicide (NiSi), or a combination thereof.

Figure 6H:
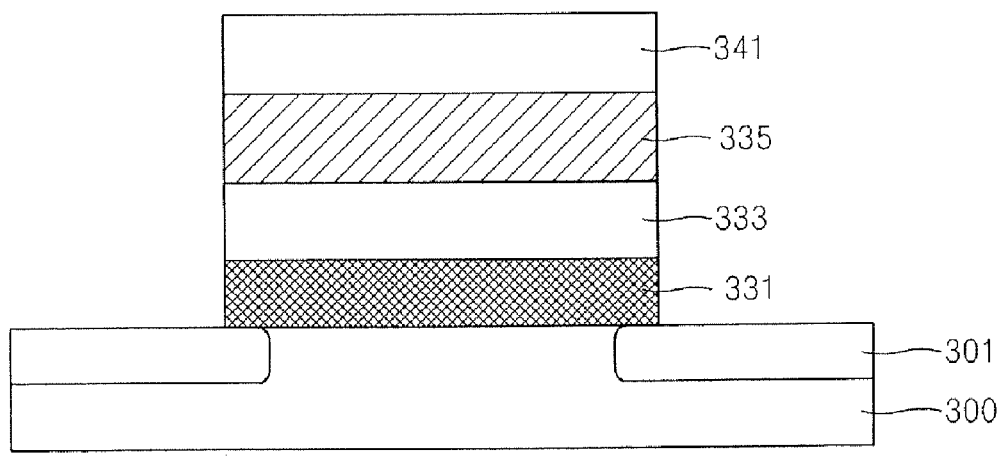

Referring to FIG. 6H, a gate structure is formed by sequentially patterning the gate conductive layer 341, the blocking insulating layer 335, the charge storage layer 333, and the tunneling insulating layer 331. Next, impurities are injected into a surface of the semiconductor layer 300 exposed by both side portions of the gate structure, thereby forming an impurities area 301 with which conductive impurities are doped. The impurities area 301 may be used as a source area and/or a drain area.

In the embodiments described with reference to FIGS. 6A through 6H, neutral beam is irradiated, and an annealing treatment is performed in order to form the tunneling insulating layer 331 and/or the blocking insulating layer 335. However, this is an example, and the present invention is not limited thereto. That is, after the neutral beam is irradiated, an annealing treatment may be omitted, or after the neutral beam is irradiated to any of the tunneling insulating layer 331 and the blocking insulating layer 335, an annealing treatment may be performed, or after neutral beam is irradiated, an annealing treatment may be omitted. Furthermore, the tunneling insulating layer 331 may be treated with a neutral beam while the blocking insulating layer 335 is not, and vice-versa.

FIGS. 7A through 7I are cross-sectional views illustrating methods of manufacturing non-volatile memory devices according to further embodiments of the present invention. FIGS. 7A through 7I illustrate methods of manufacturing the cell transistor of the embodiments described with reference to FIGS. 2, 3A, and 3B and of the embodiment described with reference to FIGS. 4 and 5. Description of the aforementioned embodiments will not be repeated. In these embodiments, after neutral beam is irradiated onto an insulating layer, another layer, for example, a capping layer, is formed on the insulating layer, and then an annealing treatment is performed. The capping layer can reduce or prevent atoms on which the neutral beam is irradiated from becoming gas in the later annealing treatment. In particular, when fluorine is used in the neutral beam, the capping layer may be formed, since the fluorine atoms can easily become gas, that is, since reduction is high.

Figure 7A:
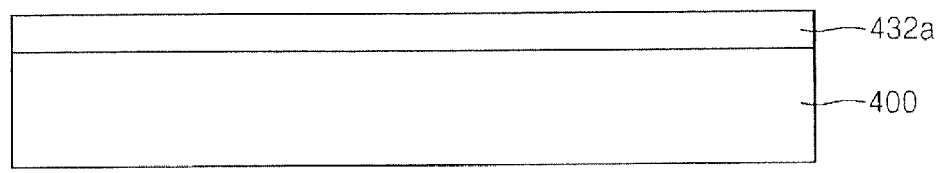
FIGS. 7A through 7I are cross-sectional views illustrating operations of manufacturing non-volatile memory devices according to further embodiments of the present invention.
Figure 7B:
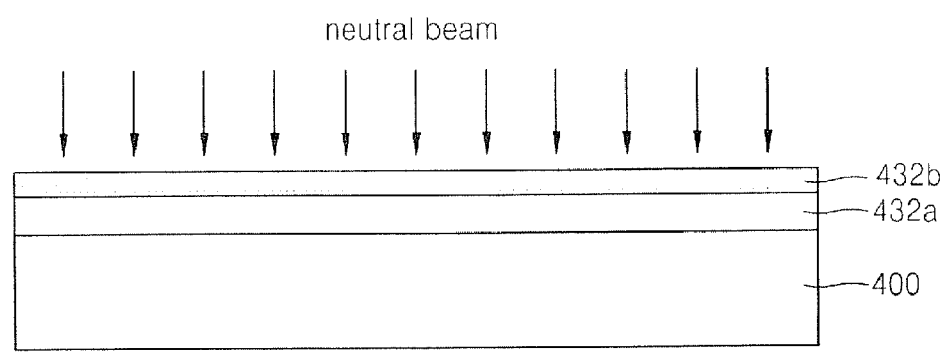

Referring to FIGS. 7A and 7B, a first insulating layer 432a is formed on a first insulating layer 432a. Next, as described in the above embodiment, the first insulating layer 432a is irradiated with a neutral beam in order to form a second insulating layer 432b.

Figure 7C:
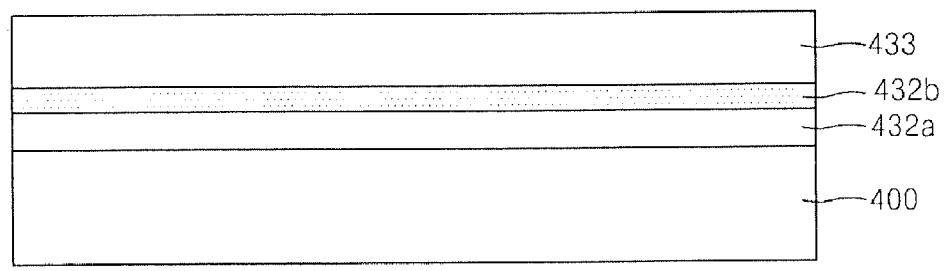

Referring to FIG. 7C, a first capping layer 433 is formed on the second insulating layer 432b. The second insulating layer 432b may be formed by CVD, LPCVD, PECVD, and/or ALD. The first capping layer 433 may include $SiO_2$, SiON, $Si_3N_4$, SRN, $Al_2O_3$, AlN, $HfO_2$, HfSiO, HfSiON, HfON, HfAlO, ZrO$_2$, Ta$_2$O$_3$, HfTa$_x$O$_y$, LaO, LaAlO, and/or LaHfO, or a combination thereof. The first capping layer 433 may be formed in a single layer structure or a multi layer structure having different energy gaps. However, the material and structure of forming the first capping layer 433 are exemplary, and the present invention is not limited thereto. The first capping layer 433 may be formed separately, or may be a layer to be a charge storage layer afterwards. FIG. 7C exemplifies a case where the first capping layer 433 is the charge storage layer 433.

Figure 7D:
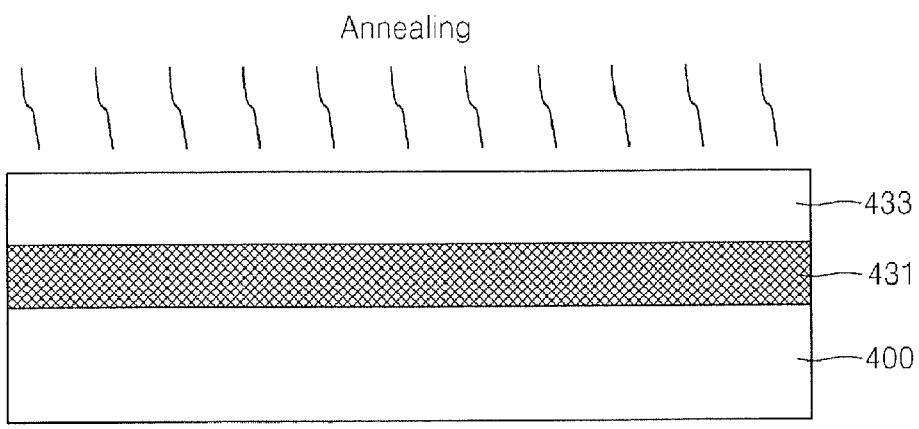

Referring to FIG. 7D, an annealing treatment is performed on results in which the first insulating layer 432a, the second insulating layer 432b, and the first capping layer 433 are formed. Conditions and effects of the annealing treatment are as described in the embodiment. Consequently, the first insulating layer 432a and the second insulating layer 432b become the tunneling insulating layer 431. In particular, when the tunneling insulating layer 431 is the charge storage layer 433, the capacity of capturing charges of the charge storage layer 433 may be controlled by properly controlling the conditions of the annealing treatment. However, this approach should be carefully used because the capacity of capturing charges may be reduced below the desired range. The annealing treatment may be optional, for example, when the first insulating layer 432a has a sufficient film quality, the annealing treatment may be omitted.

Figure 7E:
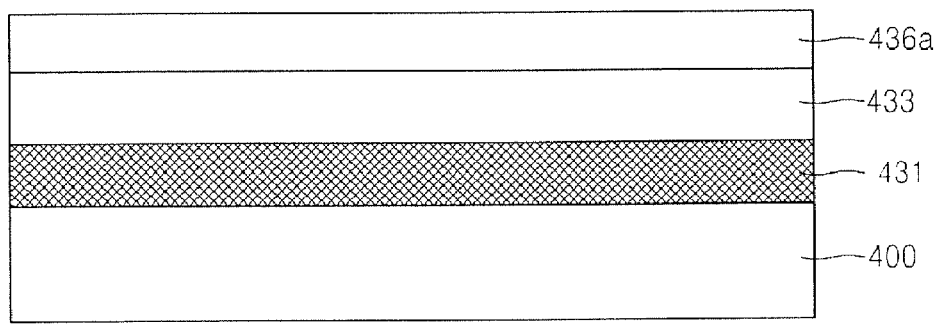
Figure 7F:
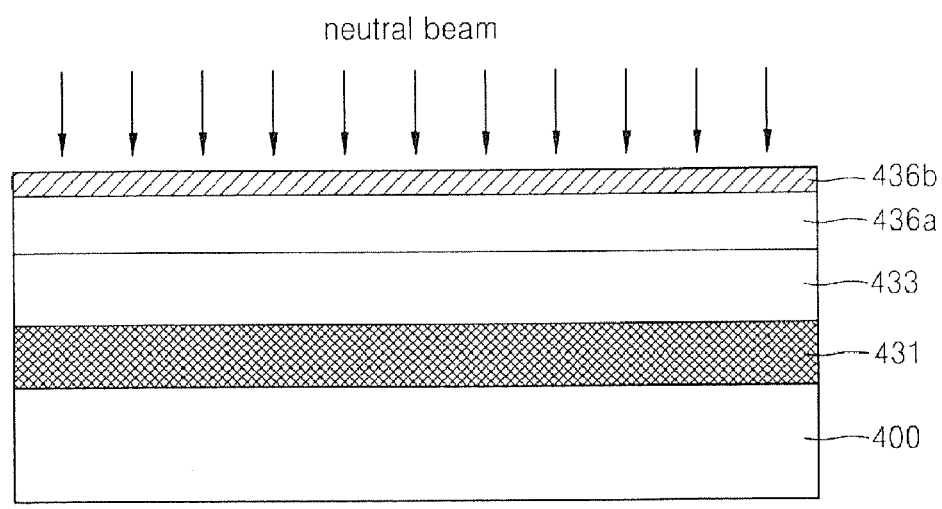

Referring to FIGS. 7E and 7F, a third insulating layer 436a is formed on the first capping layer 433, that is, on the charge storage layer 433. Next, as described in the above embodiment, the third insulating layer 436a is irradiated with a neutral beam in order to form a fourth insulating layer 436b.

Figure 7G:
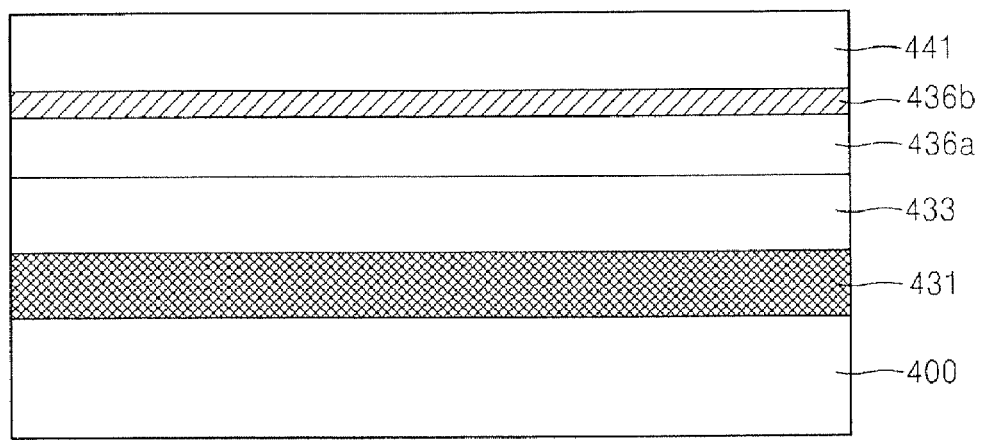

Referring to FIG. 7G, a second capping layer 441 is formed on the fourth insulating layer 436b. The second capping layer 441 may be formed by CVD, LPCVD, PECVD, and/or ALD. The second capping layer 441 may include a metal, SiO$_2$, SiON, Si$_3$N$_4$ SRN, Al$_2$O$_3$, AlN, HfO$_2$ HfSiO, HfSiON, HfON, HfAlO, ZrO$_2$, Ta$_2$O$_3$ HfTa$_x$O$_y$, LaO, LaAlO, and/or LaHfO, or a combination thereof. For example, the metal may be Pt, Pd, Ni, Ru, Co, Cr, Mo, W, Mn, Fe, Os, Ir, Ta, Au, and/or Ag. The second capping layer 441 may be formed in a single layer structure or a multi layer structure having different energy gaps. However, the material and structure of forming the second capping layer 441 presented above are just examples, and the present invention is not limited thereto. The second capping layer 441 may be formed separately, or may be a layer to be a gate conductive layer 441 afterwards. FIG. 7G exemplifies a case where the second capping layer 441 is the gate conductive layer 441. When the second capping layer 441 is the gate conductive layer, the second capping layer 441 may include poly-silicon, Al, Ru, Ta, TaN, Ti, TiN, W, WN, WSi, Hf, HfN, Nb, Mo, Mo$_2$N, RuO$_2$, Ir, Pt, Co, Cr, Pd, and/or NiSi, or a combination thereof.

Figure 7H:
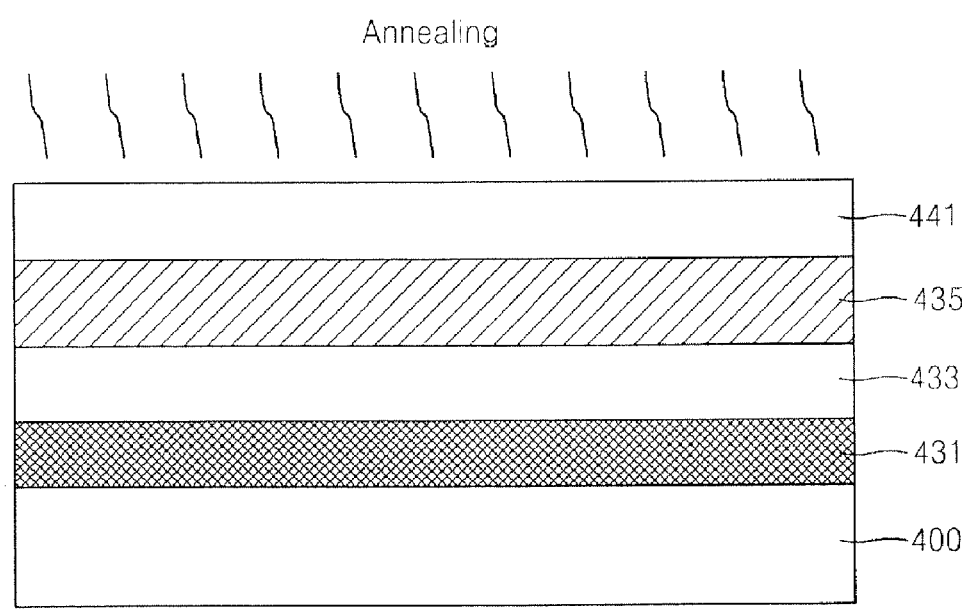

Referring to FIG. 7H, an annealing treatment is performed on the fourth insulating layer 436b on which the second capping layer 441 is formed. Conditions and effects of the annealing treatment are as described in the above embodiment. Consequently, the third insulating layer 436a and the fourth insulating layer 436b become the blocking insulating layer 435.

Figure 7I:
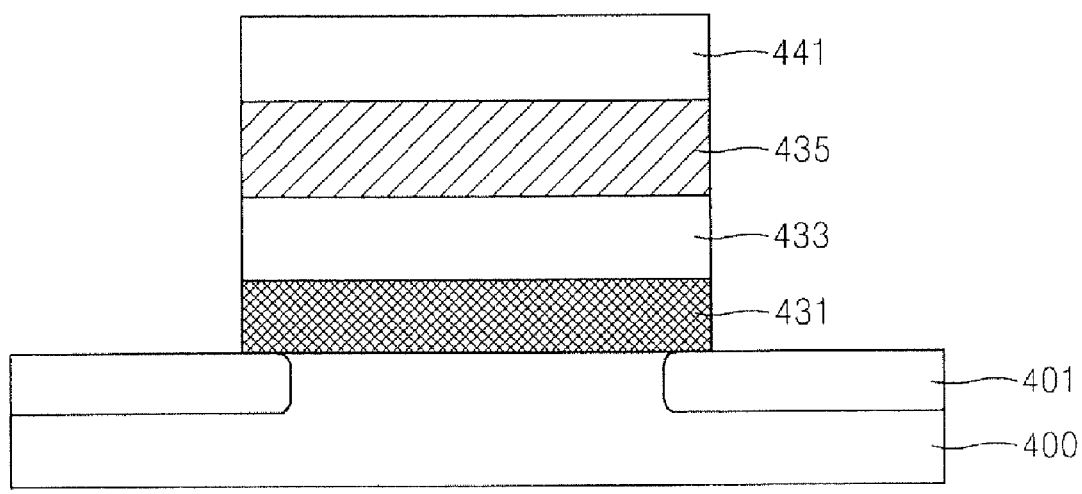

Referring to FIG. 7I, a gate structure is formed by sequentially patterning the gate conductive layer 441, the blocking insulating layer 435, the charge storage layer 433, and the tunneling insulating layer 431. Next, impurities are injected into a surface of the semiconductor layer 400 exposed by both side portions of the gate structure, thereby forming an impurities area 401 with which conductive impurities are doped. The impurities area 401 may be used as a source area and/or a drain area.

In the embodiments described with reference to FIGS. 7A through 7I, after the neutral beam is irradiated, an annealing treatment is performed in order to form both the tunneling insulating layer 431 and the blocking insulating layer 435. However, this is exemplary, and the present invention is not limited thereto. That is, after the neutral beam is irradiated, an annealing treatment may not be performed, or after neutral beam is irradiated to any of the tunneling insulating layer 431 and the blocking insulating layer 435, an annealing treatment may be performed, or after the neutral beam is irradiated, an annealing treatment may not be performed.

Figure 8:
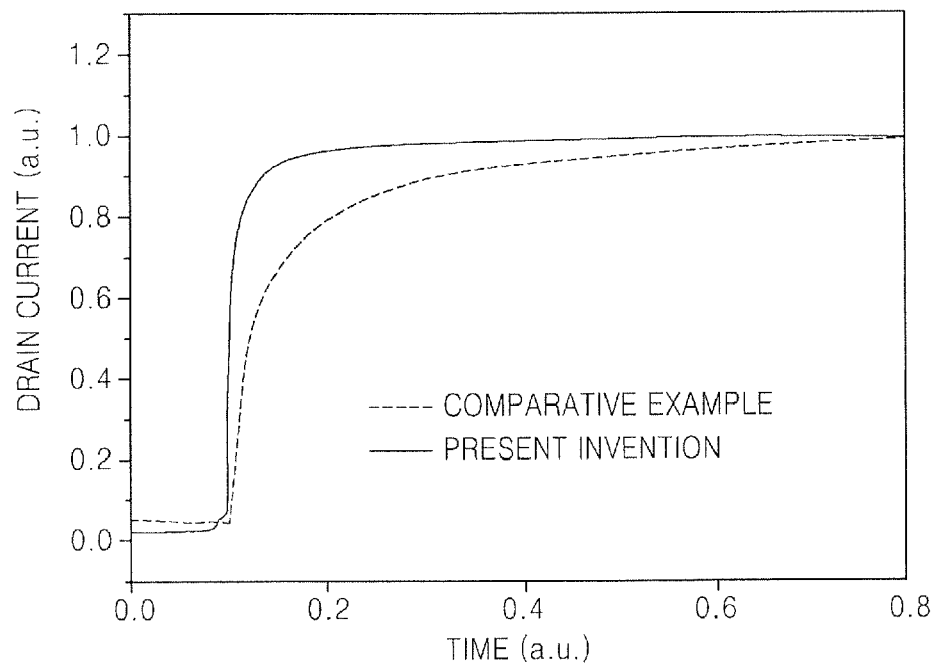
FIG. 8 is a graph illustrating variation of drain current of a non-volatile memory device according to some embodiments of the present invention.

FIG. 8 is a graph illustrating variation of drain current of a non-volatile memory device according to embodiments of the present invention. A comparative example illustrates a case where a neutral beam treatment is not performed.

Referring to FIG. 8, a drain current variation of the non-volatile memory device according to embodiments of the present invention becomes closer to a step function compared to a comparative example. Accordingly, in the non-volatile memory device according to the present invention, a current in a drain flows more rapidly when a gate is changed from an off state to an on state. Thus, characteristics of the non-volatile memory device, such as erasing speed, high temperature stability (HTS) in 1.2 k cycle, a retention characteristic, may be excellent.

Figure 9:
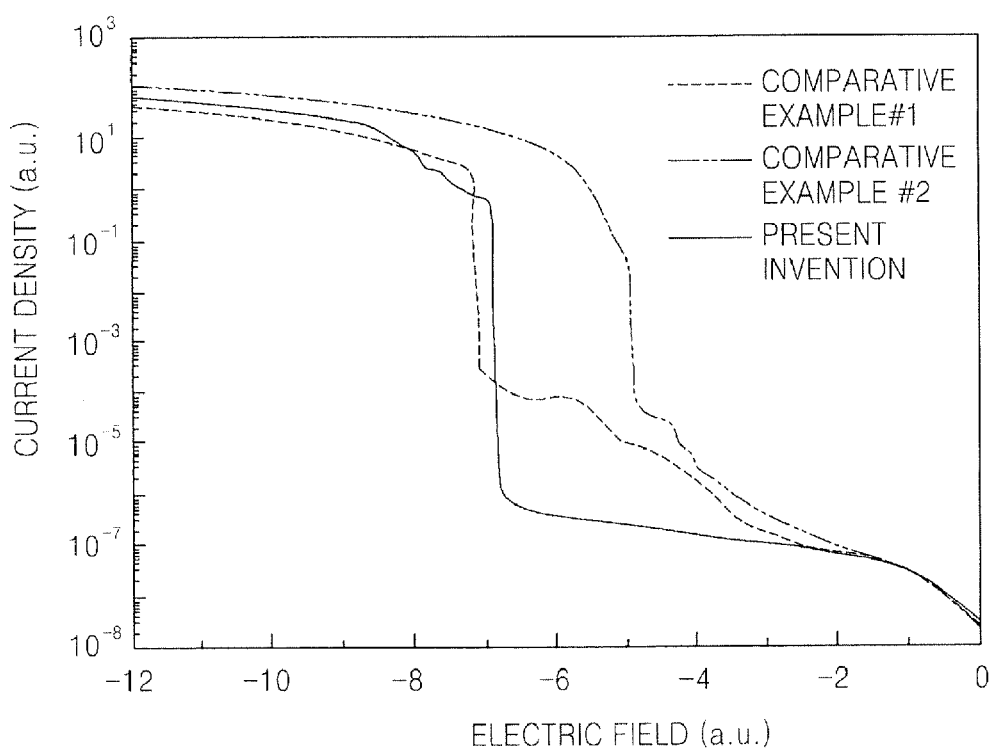
FIG. 9 is a graph illustrating variation of current density with respect to an electrical field of a non-volatile memory device according to some embodiments of the present invention.

FIG. 9 is a graph illustrating variation of current density with respect to an electrical field of a non-volatile memory device according to embodiments of the present invention. A comparative example #1 illustrates a case where a neutral beam treatment is not performed, while a comparative example #2 illustrates a case where ion beam is irradiated.

Referring to FIG. 9, in a non-volatile memory device according to some embodiments of the present invention to which neutral beam is irradiated, a width of current density variation according to the electrical field is greater than that of the comparative example #1, and an absolute value of a varying electrical field is greater than that of the comparative example #2. Accordingly, a memory window may be improved more than about 2 times, and HTS charge loss may be reduced less than half. In particular, the non-volatile memory device according to embodiments of the present invention in which a neutral beam is irradiated may have better memory device characteristics, compared to a non-volatile memory device according to the comparative example #2 in which an ion beam is irradiated.

Figure 10:
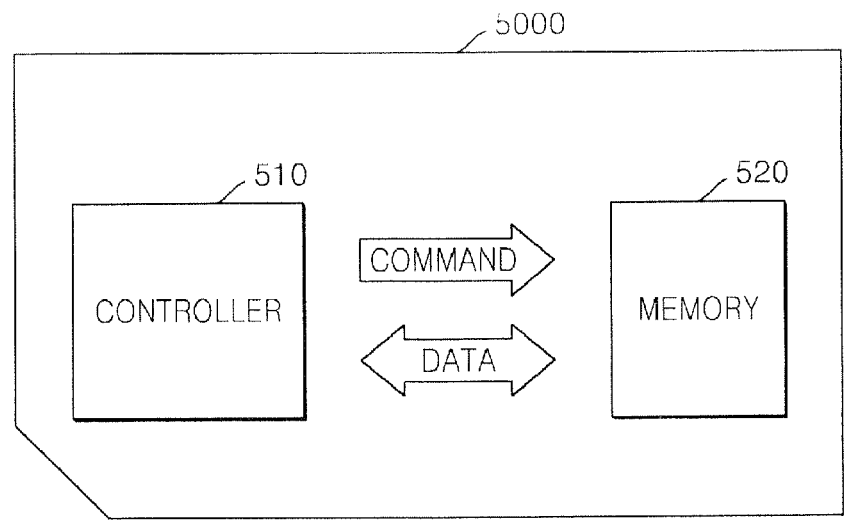
FIG. 10 is a schematic view of a memory card according to some embodiments of the present invention.

FIG. 10 is a schematic view illustrating embodiments of a memory card 5000 according to some embodiments of the present invention.

Referring to FIG. 10, a controller 510 and a memory 520 are disposed to send/receive electric signals to/from each other. For example, when the controller 510 gives a command to the memory 520, the memory 520 can send data. The memory 520 can include the non-volatile memory device 100 according to an embodiment of the present invention. The non-volatile memory devices according to the various embodiments of the present invention can be disposed in NAND or NOR architecture arrays in correspondence to the logic gate design. Such NAND and NOR arrays are generally known in the art. The memory arrays disposed in a plurality of rows and columns can have one or more memory array banks (not shown). The memory 520 can include the memory array (not shown) or the memory array bank (not shown), all of which are known in the art. The memory card 5000 can further include conventional members, such as a conventional row decoder (not shown), a column decoder (not shown), input/output (I/O) buffers (now shown), and/or a control resistor (not shown) in order to drive the memory array bank (not shown), all of which are known in the art. The memory card 5000 can be used in memory devices as a memory card, for example, such as a memory stick card, a smart media (SM) card, a secure digital (SD) card, a mini SD card, or a multi media card (MMC).

Figure 11:
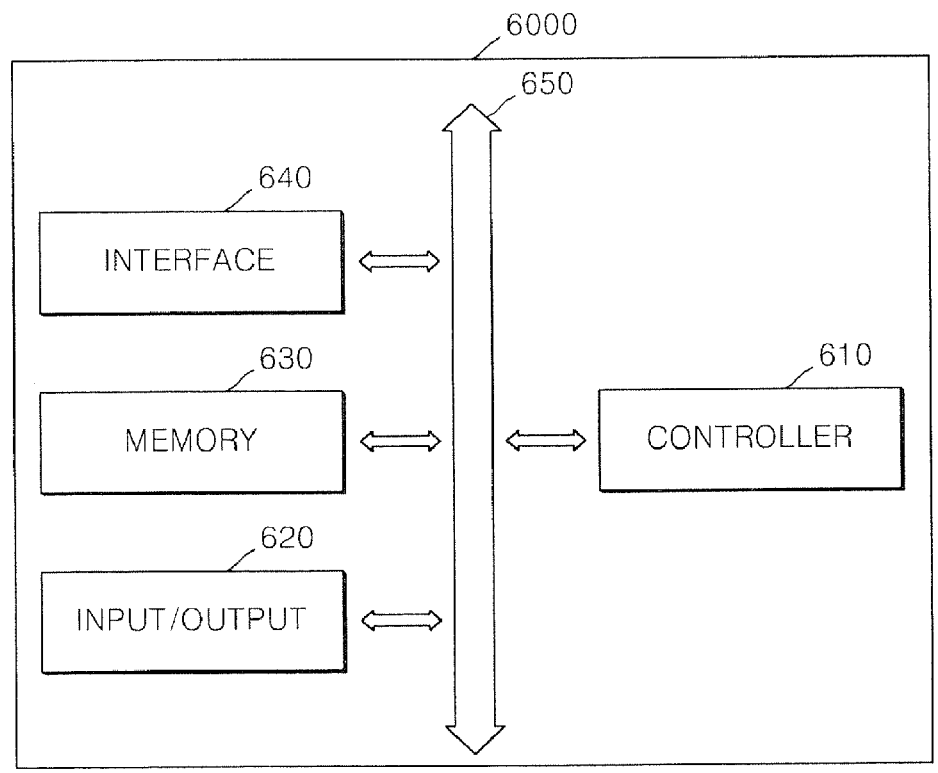
FIG. 11 is a schematic view of a system according to some embodiments of the present invention.

FIG. 11 is a schematic diagram of a system 6000 including a non-volatile memory device according to some embodiments of the present invention.

Referring to FIG. 11, the system 6000 may include a controller 610, an input/output device 620, a memory 630, and an interface 640. The system 6000 may be a mobile system or a system that transmits or receives data. The mobile system may be a personal digital assistant (PDA), a portable computer, a web tablet, a wireless phone, a mobile phone, a digital music player, or a memory card. The controller 610 executes a software program and controls the system 6000. The controller 610 may be a microprocessor, a digital signal processor, a microcontroller, or the like. The input/output device 630 can be used to input or output data of the system 6000. The system 6000 is connected to an external apparatus, for example, a personal computer or a network, using the input/output device 620, to send/receive data to/from the external apparatus. The input/output device 620 may be a keypad, a keyboard, or a display. The memory 630 may store codes and/or data for operating the controller 610 and/or may store data processed by the controller 610. The memory 630 may include a non-volatile memory device according to an embodiment of the present invention. The interface 640 may be a data transmission path between the system 6000 and an external apparatus. The controller 610, the input/output device 620, the memory 630, and the interface 640 may communicate with one another by a bus 650. For example, the system 6000 can be used for a mobile phone, a MP3 player, a navigation system, a portable multimedia player (PMP), a solid state disk (SSD), or a household appliance.

In methods of manufacturing a non-volatile memory device according to some embodiments of the present invention, defects in the insulating layer that can capture charges can be decreased by irradiating a neutral beam onto and performing an annealing treatment on, an insulating layer, thereby reducing/preventing loss of charges stored in a charge storage layer and/or increasing a charge storage capacity. As the defects in the insulating layer decreases, an obstacle to tunneling movement of the charges can be removed, and back tunneling from a blocking insulating layer to a gate conductive layer can be reduced/prevented. Accordingly, operation speed and/or high temperature stability of the non-volatile memory device can be improved, thereby increasing the reliability of a device.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of manufacturing a non-volatile memory device, comprising:
   forming a tunneling insulating layer on a semiconductor layer;
   forming a charge storage layer on the tunneling insulating layer;
   forming a blocking insulating layer on the charge storage layer;
   irradiating the blocking insulating layer with a neutral beam;
   annealing the blocking insulating layer after irradiating the blocking insulating layer; and
   forming a gate conductive layer on the blocking insulating layer;
   wherein annealing the blocking insulating layer is performed before forming the gate conductive layer.

2. The method of claim 1, wherein annealing the blocking insulating layer comprises:
   forming a capping layer on the blocking insulating layer after irradiating the blocking insulator with the neutral beam; and
   annealing the blocking insulating layer and the capping layer.

3. The method of claim 2, wherein the capping layer comprises a metal, silicon oxide ($SiO_2$), silicon oxynitride (SiON), silicon nitride ($Si_3N_4$), Si rich nitride (SRN), aluminum oxide ($Al_2O_3$), aluminum nitride (AlN), hafnium oxide ($HfO_2$), hafnium silicon oxide (HfSiO), hafnium silicon oxynitride (HfSiON), hafnium oxynitride (HfON), hafnium aluminum oxide (HfAlO), zirconium oxide ($ZrO_2$), tantalum oxide ($Ta_2O_3$), hafnium tantalum oxide ($HfTa_xO_y$), lanthanum oxide (LaO), lanthanum aluminum oxide (LaAlO), and/or lanthanum hafnium oxide (LaHfO), or a combination thereof.

4. The method of claim 1, wherein the neutral beam comprises neutral oxygen, nitrogen, fluorine, and/or chlorine atoms.

5. The method of claim 1, wherein the neutral beam has energy in the range of 1 eV through 200 eV.

6. A method of manufacturing a non-volatile memory device, comprising:
   forming a tunneling insulating layer on a semiconductor layer;
   forming a charge storage layer on the tunneling insulating layer;
   forming a blocking insulating layer on the charge storage layer;
   irradiating the blocking insulating layer with a first neutral beam;
   forming a gate conductive layer on the blocking insulating layer; and
   irradiating the tunneling insulating layer using a second neutral beam.

7. The method of claim 6, further comprising annealing the tunneling insulating layer after irradiating the tunneling insulating layer using the second neutral beam.

8. The method of claim 7, wherein annealing the tunneling insulating layer is performed before forming the charge storage layer.

9. The method of claim 7, wherein annealing the tunneling insulating layer is performed after forming the charge storage layer.

10. The method of claim 6, wherein the second neutral beam comprises neutral oxygen, nitrogen, fluorine, and/or chlorine atoms.

11. The method of claim 6, wherein the second neutral beam has energy in the range of 1 eV through 200 eV.

12. The method of claim 1, wherein the tunneling insulating layer comprises $SiO_2$, SiON, $Si_3N_4$, SRN, $Al_2O_3$, AlN, $HfO_2$, HfSiO, HfSiON, HfON, HfAlO, $ZrO_2$, $Ta_2O_3$, $HfTa_xO_y$, LaO, LaAlO, LaHfO, and/or a metallic oxide, or a combination thereof.

13. The method of claim 1, wherein the charge storage layer comprises $SiO_2$, SiON, $Si_3N_4$, SRN, $Al_2O_3$, AlN, $HfO_2$, HfSiO, HfSiON, HfON, HfAlO, ZrO$_2$, Ta$_2$O$_3$, HfTa$_x$O$_y$, LaO, LaAlO, LaHfO, and/or a metallic oxide, or a combination thereof.

14. The method of claim 1, wherein the blocking insulating layer comprises SiO$_2$, SiON, Si$_3$N$_4$, SRN, Al$_2$O$_3$, AlN, HfO$_2$, HfSiO, HfSiON, HfON, HfAlO, ZrO$_2$, Ta$_2$O$_3$, HfTa$_x$O$_y$, LaO, LaAlO, LaHfO, and/or a metallic oxide, or a combination thereof.

15. The method of claim 1, wherein the gate conductive layer comprises poly-silicon, Al, Ru, Ta, TaN, Ti, TiN, W, WN, WSi, Hf, HfN, Nb, Mo, Mo$_2$N, RuO$_2$, Ir, Pt, Co, Cr, Pd, and/or NiSi, or a combination thereof.

16. The method of claim 1, wherein the semiconductor layer comprises a silicon substrate, a silicon-on-insulator substrate, a silicon-on-sapphire substrate, a germanium substrate, a silicon-germanium substrate, and/or a gallium-arsenide substrate.

17. A method of manufacturing a non-volatile memory device, comprising:

forming a tunneling insulating layer on a semiconductor layer;

irradiating the tunneling insulating layer with a first neutral beam;

forming a first capping layer on the irradiated tunneling insulating layer;

forming a charge storage layer on the tunneling insulating layer;

forming a blocking insulating layer on the charge storage layer;

irradiating the blocking insulating layer with a second neutral beam;

forming a second capping layer on the irradiated blocking insulating layer; and forming a gate conductive layer on the blocking insulating layer.

* * * * *